(12) United States Patent
Michal et al.

(10) Patent No.: US 9,892,877 B2
(45) Date of Patent: Feb. 13, 2018

(54) CIRCUIT TO IMPLEMENT A DIODE FUNCTION

(71) Applicant: STMicroelectronics (Alps) SAS, Grenoble (FR)

(72) Inventors: Vratislav Michal, Grenoble (FR); Denis Cottin, Crolles (FR)

(73) Assignee: STMICROELECTRONICS (ALPS) SAS, Grenoble (FR)

( * ) Notice: Subject to any disclaimer, the term of this patent is extended or adjusted under 35 U.S.C. 154(b) by 378 days.

(21) Appl. No.: 14/657,991

(22) Filed: Mar. 13, 2015

(65) Prior Publication Data

US 2015/0262776 A1 Sep. 17, 2015

(30) Foreign Application Priority Data

Mar. 13, 2014 (FR) ...................................... 14 52101

(51) Int. Cl.
*H01H 47/00* (2006.01)
*H03K 17/16* (2006.01)
*H03K 17/30* (2006.01)

(52) U.S. Cl.
CPC ........... *H01H 47/00* (2013.01); *H03K 17/167* (2013.01); *H03K 17/30* (2013.01); *H03K 2017/307* (2013.01); *Y10T 307/76* (2015.04)

(58) Field of Classification Search
None
See application file for complete search history.

(56) References Cited

U.S. PATENT DOCUMENTS

| 6,064,224 | A | * | 5/2000 | Esch, Jr. | ............ H03K 19/0005 326/30 |
| 6,570,447 | B2 | * | 5/2003 | Cyrusian | ............. H03F 3/45197 327/346 |
| 7,952,382 | B2 | * | 5/2011 | Moon | .................... G11C 5/063 326/30 |
| 2002/0135235 | A1 | | 9/2002 | Winick et al. | |
| 2011/0298443 | A1 | | 12/2011 | Kanemitsu | |

FOREIGN PATENT DOCUMENTS

EP 0978943 A2 2/2000

* cited by examiner

*Primary Examiner* — Long Nguyen
(74) *Attorney, Agent, or Firm* — Seed Intellectual Property Law Group LLP

(57) ABSTRACT

A circuit including: a plurality of first switches connected in parallel between a first terminal and a second terminal; and a control circuit capable of implementing the following steps at each period of a clock signal: comparing the voltage between the first and second terminals with a reference voltage; if the voltage between the first and second terminals is greater than the reference voltage, turning on one of the first switches without modifying the state of the other switches; and if the voltage between the first and second terminals is smaller than the reference voltage, turning off one of the first switches without modifying the state of the other switches.

25 Claims, 3 Drawing Sheets

CIRCUIT TO IMPLEMENT A DIODE FUNCTION

BACKGROUND

Technical Field

The present disclosure generally relates to electronic circuits, and more particularly to at an active circuit capable of implementing a diode function.

Discussion of the Related Art

FIG. 1 shows an electronic diagram of a circuit 1 capable of implementing a diode function, that is, capable of conducting a current between a first terminal A of the circuit and a second terminal K of the circuit when the voltage between terminals A and K is positive, and of blocking the current flow between terminals A and K when the voltage between terminals A and K is negative. Such a circuit may for example be used in a system where a secondary battery is recharged from a primary battery to avoid, at the end of charge, for the secondary battery to discharge into the primary battery.

Circuit 1 of FIG. 1 comprises, connected between terminals A and K, a switch 3 having an internal resistance $r_{on}$ in the on state. Circuit 1 further comprises an operational amplifier 5 assembled as a voltage comparator, having a positive input connected to terminal A, a negative input connected to terminal K, and an output connected to a control node of switch 3.

Circuit 1 operates as follows. When the voltage between terminals A and K is greater than 0 V, the output of comparator 5 is at a level causing the turning on of switch 3 and, when the voltage between terminals A and K is smaller than 0 V, the output of comparator 5 is at a level causing the turning off of switch 3. Thus, when the voltage between terminals A and K is positive, circuit 1 enables a current to flow between terminals A and K, and when the voltage between terminals A and K is negative, circuit 1 blocks the current flow between terminals A and K.

FIG. 2 is a diagram showing the ideal targeted current-to-voltage characteristic of circuit 1 of FIG. 1. The axis of abscissas shows voltage V between terminals A and K and the axis of ordinates shows current I between terminals A and K. In this example, the operational amplifier is considered to be ideal, that is, it enables to control the turning on of switch 3 as soon as voltage V becomes greater than 0 V, and the turning off of switch 3 as soon as voltage V becomes smaller than 0 V. When voltage V is negative, switch 3 is off, and current I is zero. When voltage V is positive, switch 3 is turned on, and current I is determined by proportionality relation $I=V/r_{on}$.

However, in practice, a comparator is never ideal, and inevitably has an offset voltage $V_{os}$ between its positive input and its negative input. As a result, voltage V between terminals A and K, instead of being compared to zero, is actually compared to the value of offset voltage $V_{os}$, which causes an unwanted offset of the switching threshold of circuit 1. It should be noted that offset voltage $V_{os}$ is a characteristic which, for a given comparator type, may vary according to manufacturing dispersions.

FIG. 3 is a diagram showing the real current-to-voltage characteristic of circuit 1 of FIG. 1 in two unfavorable cases. More particularly, FIG. 3 comprises a curve C1, in dotted lines, showing the current-to-voltage characteristic of circuit 1 in the case where operational amplifier 5 has a negative offset voltage $V_{os}=V_{os(min)}$, for example, equal to −5 mV, and a curve C2, in full line, showing the current-to-voltage characteristic of circuit 1 in the case where operational amplifier 5 has a positive offset voltage $V_{os}=V_{os(max)}$, for example, equal to 5 mV. In the first case (curve C1), switch 3 switches when voltage V reaches threshold $V_{os(min)}$, and an unwanted negative current $I_{os(min)}=V_{os(min)}/r_{on}$ may then flow between terminals A and K. In the second case (curve C2), switch 3 switches when voltage V reaches threshold $V_{os(min)}$. At the turning-off of the device, the conduction is then interrupted while a positive current $I_{os(max)}=V_{os(max)}/r_{on}$ still flows between terminals A and K. This may in particular cause an unwanted oscillation of the switch.

Such a shifting of the switching threshold with respect to the targeted 0-V threshold may pose accuracy problems in certain applications. Essentially, in the case of a negative offset voltage $V_{os}$, the circuit may conduct a current in the wrong direction when the voltage between terminals A and K is negative, and in the case of a positive offset voltage $V_{os}$, the circuit may prevent current from flowing between terminals A and K when the voltage between terminals A and K is positive.

As an illustration, for a resistance $r_{on}$ of 50 mΩ and for an offset voltage of ±5 mV, the current inaccuracy of the circuit is ±100 mA, which is far from negligible.

Further, the abrupt turning-on of switch 3 when voltage V is not strictly zero may cause current peaks. In the case where switch 3 is a MOS transistor, charge injection issues may add to the current peaks. This may pose problems of electromagnetic compatibility with neighboring systems. Further, the flowing of a non-negligible current I between terminals A and K when voltage V is negative (curve C1) may cause malfunctions in certain applications.

To overcome such disadvantages, a solution comprises attempting to decrease the offset voltage of comparator 5. Known solutions to decrease the offset voltage of a comparator may however raise other issues. Further, the provided improvement remains insufficient for certain applications.

BRIEF SUMMARY

Thus, an embodiment provides a circuit that includes a plurality of first switches connected in parallel between a first terminal and a second terminal; and a control circuit capable of implementing the following steps at each period of a clock signal: comparing the voltage between the first and second terminals with a reference voltage; if the voltage between the first and second terminals is greater than the reference voltage, turning on one of the first switches without modifying the state of the other switches; and if the voltage between the first and second terminals is smaller than the reference voltage, turning off one of the first switches without modifying the state of the other switches.

According to an embodiment, the control circuit comprises a unit for controlling the first switches, and a first comparator.

According to an embodiment, the first comparator has a negative input connected to a node of application of the reference voltage, a positive input connected to the first terminal, and an output connected to an input of the control unit.

According to an embodiment, the control circuit includes a second switch series-connected with a current source between the first terminal and a node of application of a reference potential, and the first comparator has a positive input connected to the first terminal, a negative input connected to the junction point of the second switch and of the current source, and an output connected to an input of the control unit.

According to an embodiment, the second switch is of the same type as the first switches.

According to an embodiment, the second switch is an image at a decreased scale of one of the first switches.

According to an embodiment, the circuit further includes a second comparator having a negative input connected to the second terminal, a positive input connected to the first terminal, and an output connected to an activation input of the control circuit.

According to an embodiment, each comparator includes an operational amplifier.

According to an embodiment, each first switch includes a MOS transistor.

According to an embodiment, each first switch includes two series-connected MOS transistors having their gates connected.

The foregoing and other features and advantages will be discussed in detail in the following non-limiting description of specific embodiments in connection with the accompanying drawings.

DETAILED DESCRIPTION

Figure 1:
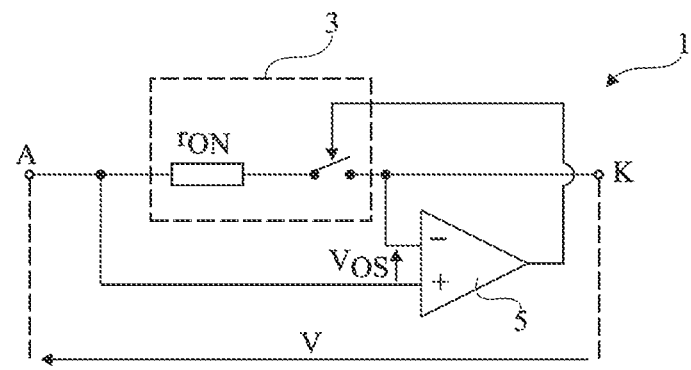
FIG. 1, previously described, is an electric diagram of an example of a circuit capable of implementing a diode function.
Figure 2:
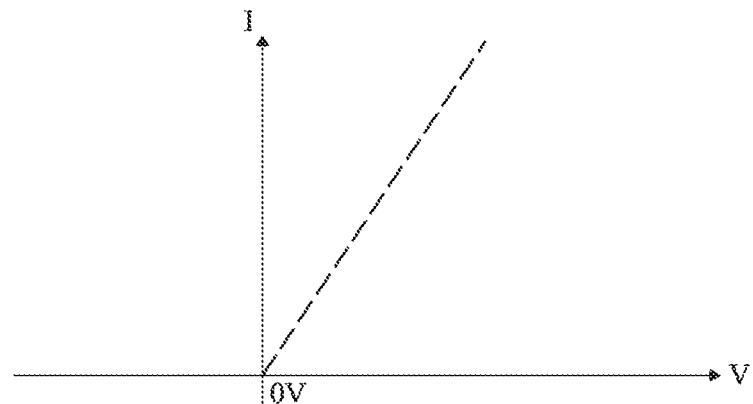
FIG. 2, previously described, is a diagram showing the ideal targeted current-to-voltage characteristic of the circuit of FIG. 1.
Figure 3:
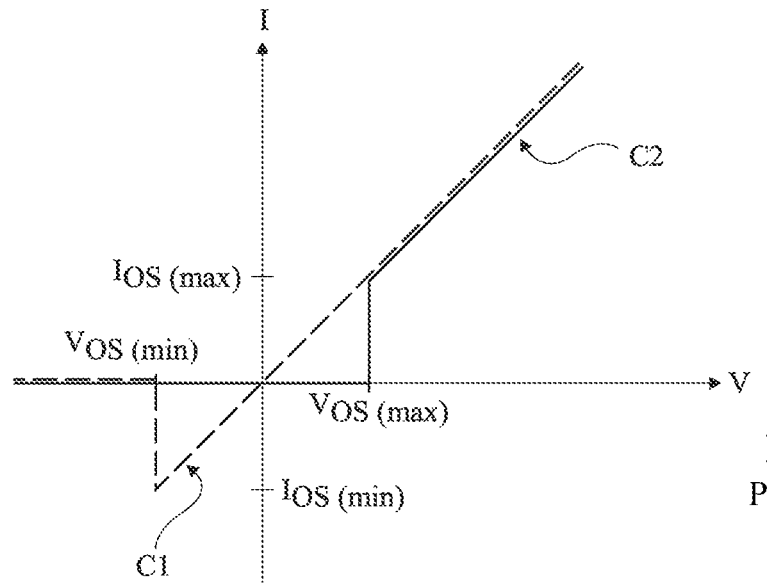
FIG. 3, previously described, is a diagram showing the real current-to-voltage characteristic of the circuit of FIG. 1.

For clarity, the same elements have been designated with the same reference numerals in the various drawings and, further, the various drawings are not to scale. Further, only those elements which are useful to the understanding of the described embodiments have been detailed. In particular, the applications where the diode circuits described in the present application may be used have not been detailed, the described embodiments being compatible with usual applications of a circuit capable of implementing a diode function.

Figure 4:
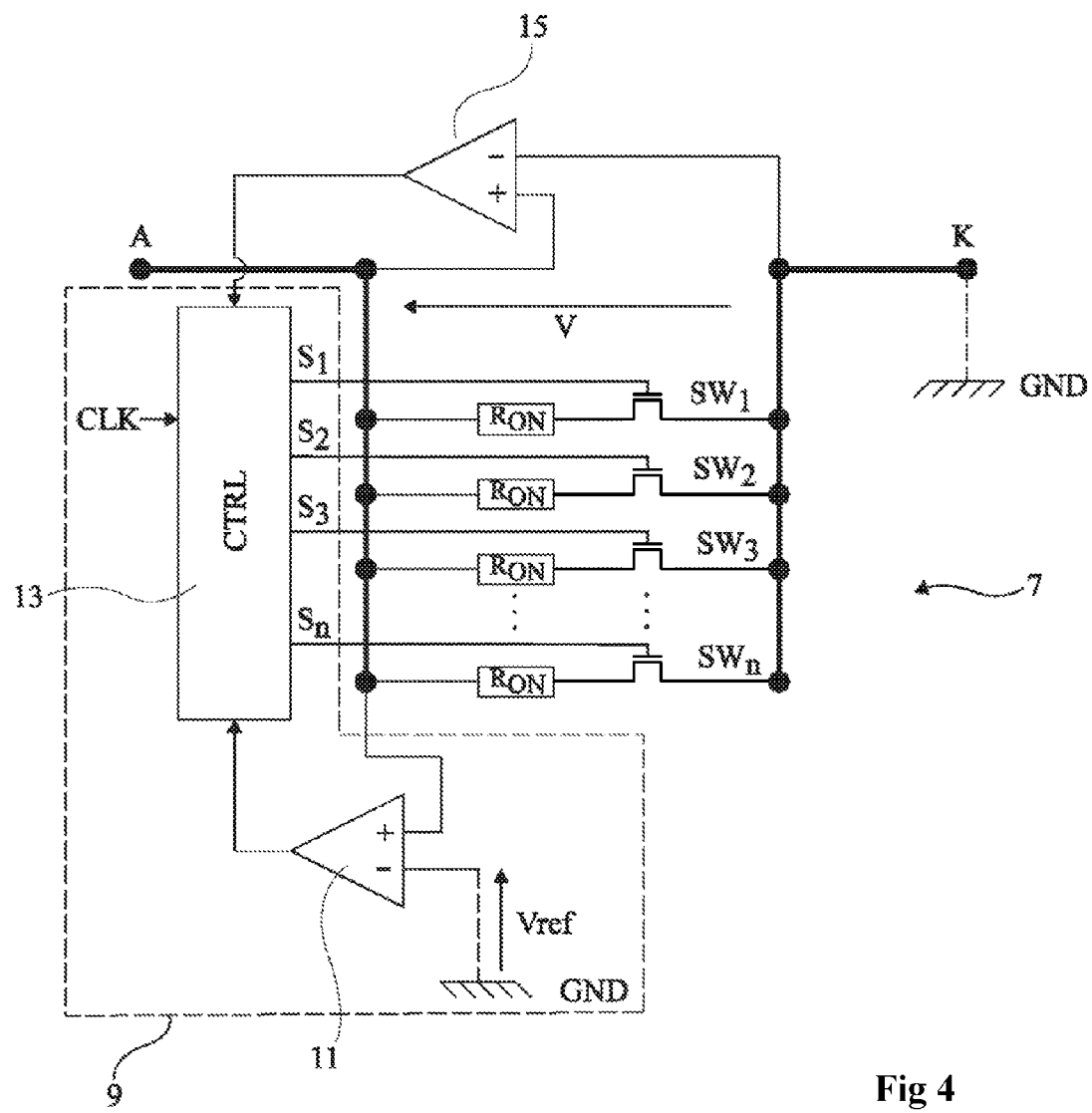
FIG. 4 is an electric diagram of an embodiment of a circuit capable of implementing a diode function.

FIG. 4 is an electric diagram of an embodiment of a circuit 7 capable of implementing a diode function, that is, capable of conducting a current between a first terminal (or node) A of the circuit and a second terminal (or node) K of the circuit when voltage V between terminals A and K is positive, and of blocking the current flow between terminals A and K when voltage V between terminals A and K is negative.

Circuit 7 comprises a plurality of switches $SW_i$ connected in parallel between terminals A and K, where i is an integer in the range from 1 to n and n is an integer greater than or equal to 2, for example, in the range from 2 to 30. Switches $SW_i$ are for example all substantially identical. Each switch $SW_i$ has an internal resistance $R_{on}$ in the on state. As an example, each switch $SW_i$ may be formed of a MOS transistor connected between terminals A and K. As a variation, to do away with unwanted effects due to the parasitic diodes of the MOS transistors, each switch $SW_i$ may comprise two MOS transistors of the same type series-connected between terminals A and K, having their gates capable of receiving a same control signal. Other types of switches may however be used.

Circuit 7 of FIG. 4 further comprises a circuit 9 for controlling switches $SW_i$, comprising a comparator 11 and a switch control unit 13 (CTRL). Comparator 11, for example, an operational amplifier assembled as a comparator, has a positive input connected to terminal A and a negative input capable of receiving a reference voltage $V_{ref}$. In this example, voltage $V_{ref}$ is defined with respect to a terminal or a node of application of a reference potential GND, for example, the ground, and terminal K is connected to terminal GND. Control unit 13 comprises a plurality of outputs $S_i$, each output $S_i$ of circuit 13 being connected to a control node of switch $SW_i$ of same rank. Control unit 13 further comprises an input connected to the output of comparator 11, and an input capable of receiving a clock signal CLK.

In this example, circuit 7 further comprises a comparator 15, for example, an operational amplifier assembled as a comparator, having a positive input connected to terminal A, a negative input connected to terminal K, and an output connected to an activation/deactivation input of control unit 13. Comparator 15 may have an offset voltage $V_{os}$.

Circuit 7 operates as follows. When voltage V between terminals A and K is greater than offset voltage $V_{os}$ of comparator 15, the output of comparator 15 is at a level such that control unit 13 is activated. When voltage V between terminals A and K is smaller than offset voltage $V_{os}$, the output of comparator 15 is at a level such that control unit 13 is deactivated.

Just after an activation, unit 13 is in a state such that switch $SW_1$ is controlled to be in the on (conductive) state, and all switches $SW_i$ are controlled to be in the off (blocked) state.

When unit 13 is active, unit 13 examines the output of comparator 11 and, at each period of clock signal CLK, accordingly controls switches $SW_i$ as follows:

if only switch $SW_1$ is in the on state, if the output signal of comparator 11 indicates that voltage V is greater than voltage $V_{ref}$, unit 13 controls the turning-on of switch $SW_2$ and maintains the control of the other switches unchanged, otherwise, unit 13 does not modify the switch control;

if switches $SW_1$ and $SW_2$ are in the on state and at least one of the other switches $SW_i$ is in the off state, if the output signal of comparator 11 indicates that voltage V is greater than voltage $V_{ref}$, unit 13 controls the turning-on of switch $SW_{j+1}$, where j is the rank of the last switch $SW_i$ to have been turned on by unit 13, and maintains unchanged the control of the other switches, and if the output signal of comparator 11 indicates that voltage V is smaller than voltage $V_{ref}$, unit 13 controls the turning-off of switch $SW_j$, and maintains unchanged the control of the other switches; and if all switches $SW_i$ are on, if the output signal of comparator 11 indicates that voltage V is greater than voltage $V_{ref}$, no action is performed by unit 13, and if the output signal of comparator 11 indicates that voltage V is smaller than voltage $V_{ref}$, unit 13 controls the turning-off of switch $SW_n$ and maintains switches $SW_1$ and $SW_{n-1}$ in the on state.

Thus, control circuit 9 controls switches $SW_i$ so that voltage V between terminals A and K always remains as close as possible to reference voltage $V_{ref}$. The number of switches $SW_i$ which are turned on automatically adjusts, at the rate of clock signal CLK, when the current flowing between terminals A and K varies, to maintain voltage V between terminals A and K close to voltage $V_{ref}$.

As an example, control unit 13 may comprise a microcontroller, a shift register, or any other element capable of implementing the above-described operation.

For a given application, internal resistance $R_{on}$ of each switch $SW_i$ of circuit 7 is greater than internal resistance $r_{on}$ of switch 3 of circuit 1 of FIG. 1. As an example, switches $SW_i$ are sized so that, when all switches $SW_i$ are on, the value of the resistance between terminals A and K is substantially equal to the value of resistance $r_{on}$ of circuit 1 of FIG. 1.

An advantage of circuit 7 is that on switching of the circuit, the resistance between nodes A and K is equal to the internal resistance of switch $SW_1$. The inaccuracy of the circuit in terms of current is then defined by $I_{os}=V_{os}/R_{on}$, where $V_{os}$ is the offset voltage (in absolute value) of comparator 11 and/or 15. As a non-limiting illustration, for a resistance $R_{on}$ of 1 Ω and for an offset voltage of ±5 mV, the inaccuracy of circuit 7 in terms of current is ±5 mA, which is quite acceptable for many applications.

Another advantage of circuit 7 of FIG. 4 is that at the turning-on of the circuit, switches $SW_i$ are sequentially turned on one after the other. Each switch $SW_i$ having a relatively high resistance $R_{on}$ with respect to resistance $r_{on}$ of a circuit of the type described in relation with FIG. 1, the current peak, of amplitude $V/R_{on}$, occurring during the switching when V is different from 0 V, is much smaller than the current peak, of amplitude $V/r_{on}$, which would occur with a circuit of the type described in relation with FIG. 1. Further, the progressive switching of switches $SW_i$ avoids a number of disadvantages due to charge injection phenomena.

Figure 5:
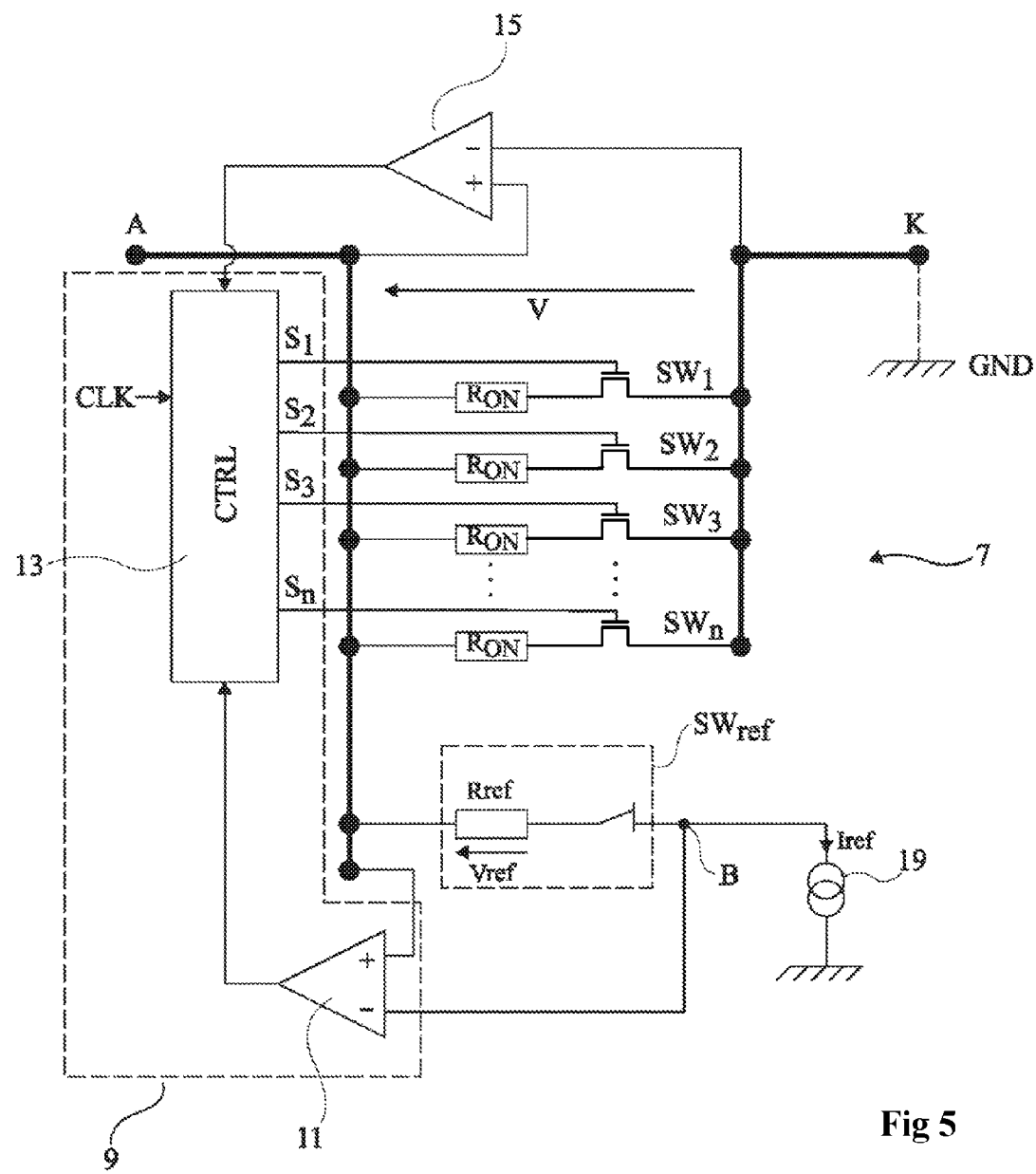
FIG. 5 is an electric diagram illustrating in further detail an embodiment of the circuit of FIG. 4.

FIG. 5 is an electric diagram illustrating in further detail an alternative embodiment of circuit 7 of FIG. 4. The circuit of FIG. 5 shows elements in common with the circuit of FIG. 4. These elements will not be described again hereafter. In the following, only the differences between the circuits of FIGS. 4 and 5 will be detailed.

The circuit of FIG. 5 comprises a switch $SW_{ref}$ in series with a D.C. current source 19 between terminal A and node GND. The negative input of comparator 11 is connected to a node B forming the junction point of switch $SW_{ref}$ and of current source 19. Switch $SW_{ref}$ is connected to be constantly on. Switch $SW_{ref}$ has an internal resistance $R_{ref}$ in the on state. Switch $SW_{ref}$ is preferably similar or identical to switches $SW_i$. As an example, switch $SW_{ref}$ is of the same type and substantially has the same dimensions and thus the same internal resistance $R_{ref}$ as each of switches $SW_i$. As a variation, switch $SW_{ref}$ is at a decreased scale of switches $SW_i$, and has an internal resistance $\alpha*R_{on}$, where α is a coefficient greater than 1 and preferably much greater than 1. Current source 19 is capable of delivering a constant reference current $I_{ref}$. A reference voltage $V_{ref}$ is then defined across switch $SW_{ref}$ by relation $V_{ref}=I_{ref}*R_{ref}=I_{ref}*\alpha*R_{on}$, and comparator 11 switches when voltage $V-V_{ref}$ changes sign.

An advantage of circuit 7 of FIG. 5 is that the current thresholds causing the switching of the different switches $SW_i$ are little temperature-dependent, and are determined by value $I_{ref}$ of the current generated by source 19. In particular, when switches $SW_i$ and $SW_{ref}$ are of the same type, the temperature variations of their internal resistances are substantially of the same order. Thus, for a given number of switches $SW_i$ in the on state, the ratio of the internal resistance of circuit 7 between terminals A and K to internal resistance $R_{ref}$ of switch $SW_{ref}$ remains substantially constant whatever the operating temperature of the circuit.

As a non-limiting example, current $I_{ref}$ delivered by source 19 has an intensity in the range from 100 nA to 10 µA, for example, equal to 1 µA, and reference voltage $V_{ref}$ is smaller than 100 mV, for example, equal to 25 mV.

An advantage of the described embodiments is that they enable to significantly decrease the inaccuracy in terms of current with no additional accuracy constraint for comparators as compared with a circuit of the type described in relation with FIG. 1. Further, the smooth and progressive switching of the circuit significantly decreases current surges, and thus risks of electromagnetic disturbances with respect to a circuit of the type described in relation with FIG. 1.

Specific embodiments have been described. Various alterations, modifications, and improvements will readily occur to those skilled in the art.

It should in particular be noted that comparator 15 of the examples of FIGS. 4 and 5 is optional. In the absence of comparator 15, control unit 13 may be permanently activated, and may decide alone or not to allow the flowing of a current between terminals A and K. However, the presence of comparator 15 has the advantage of enabling to deactivate circuit 13 when voltage V is smaller than voltage $V_{os}$, and thus to spare power when circuit 7 is in the off state.

Further, although, in the embodiments of FIGS. 4 and 5, the voltage comparators are operational amplifiers assembled as comparators, other types of comparators may be used.

Further, the described embodiments are not limited to the specific example of circuit of generation of reference voltage $V_{ref}$ of FIG. 5. More generally, other reference voltage generation circuits may be used.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A circuit, comprising:
a first terminal and a second terminal;
a plurality of first switches coupled in parallel between the first terminal and the second terminal; and
a control circuit that is configured at each period of a clock signal to:
compare a voltage between the first and second terminals with a reference voltage;
if the voltage between the first and second terminals is greater than the reference voltage, turn on one of the first switches and maintain a state of other ones of the first switches; and
if the voltage between the first and second terminals is smaller than the reference voltage, turn off one of the first switches and maintain the state of the other ones of the switches; and a first comparator having a first input coupled to the first terminal, and a second input coupled to the second terminal, the first comparator being configured to output a control signal to the control circuit.

2. The circuit of claim 1 wherein the control circuit includes a second comparator and a control unit configured to control the first switches.

3. The circuit of claim 2 wherein the second comparator has a negative input coupled to a node of application of the reference voltage, a positive input coupled to the first terminal, and an output coupled to an input of the control unit.

4. The circuit of claim 2 wherein the control circuit includes a second switch series-coupled with a current source between the first terminal and a node of application of a reference potential, and wherein the second comparator has a positive input coupled to the first terminal, a negative input coupled to a junction point of the second switch and of the current source, and an output coupled to an input of the control unit.

5. The circuit of claim 4 wherein the second switch is of the same type as the first switches.

6. The circuit of claim 4 wherein the second switch is at a decreased scale of one of the first switches.

7. The circuit of claim 2 wherein the second input of the first comparator is a negative input coupled to the second terminal, and the first input of the first comparator is a positive input coupled to the first terminal, the first comparator further having an output coupled to an activation input of the control circuit.

8. The circuit of claim 7 wherein each of the first comparator and the second comparator comprises an operational amplifier.

9. The circuit of claim 1 wherein each first switch comprises a MOS transistor.

10. The circuit of claim 1 wherein each first switch comprises two series-coupled MOS transistors having their gates coupled together.

11. A method, comprising:
generating a first control signal by a first comparator having a first input coupled to a first terminal and a second input coupled to a second terminal;
receiving, by a control circuit, the control signal; and
controlling a plurality of first switches that are coupled in parallel between the first terminal and the second terminal, at each period of a clock signal the controlling including:
comparing a voltage between the first and second terminals with a reference voltage;
if the voltage between the first and second terminals is greater than the reference voltage, turning on one of the first switches and maintaining a current state of other ones of the first switches; and
if the voltage between the first and second terminals is smaller than the reference voltage, turning off one of the first switches maintaining the state of the other ones of the switches.

12. The method of claim 11 wherein the controlling includes:
comparing the reference voltage with a voltage on the first terminal; and
providing second control signals to the first switches based on the comparing of the reference voltage with the voltage on the first terminal.

13. The method of claim 12 wherein the controlling further includes:
providing the second control signals based additionally on the first control signal.

14. The method of claim 11, further comprising:
activating the control circuit based on the first control signal.

15. The method of claim 11 wherein generating the first control signal includes generating the first control signal based on whether a voltage between the first and second terminals is greater than an offset voltage of the first comparator.

16. A device, comprising:
a first terminal;
a second terminal;
a first plurality of switches coupled between the first terminal and the second terminal;
a control circuit coupled to each one of the first plurality of switches and configured to provide a control signal to each one of the first plurality of switches; and
a first comparator having a first input coupled to a reference voltage and a second input coupled to the first terminal, and an output coupled to a first input of the control circuit; and
a second comparator having a first input coupled to the first terminal, a second input coupled to the second terminal, and an output coupled to a second input of the control circuit.

17. The device of claim 16, further comprising a second switch and a current source, the second switch coupled between the current source and the first terminal.

18. The device of claim 17 wherein the reference voltage is provided by a node between the current source and the second switch.

19. The device of claim 16 wherein the output of the second comparator is configured to activate the control circuit when an offset voltage of the second comparator is less than a voltage between the first and second terminals, and the output of the second comparator is configured to deactivate the control circuit when the offset voltage of the second comparator is greater than the voltage between the first and second terminals.

20. The device of claim 16 wherein the second input of the control signal is an activation input of the control circuit, and the second comparator outputs a control signal that controls activation and deactivation of the control circuit.

21. A circuit, comprising:
a first terminal and a second terminal;
a plurality of first switches coupled in parallel between the first terminal and the second terminal; and
a control circuit that is configured at each period of a clock signal to:
compare a voltage between the first and second terminals with a reference voltage;
if the voltage between the first and second terminals is greater than the reference voltage, turn on one of the first switches and maintain a state of other ones of the first switches; and
if the voltage between the first and second terminals is smaller than the reference voltage, turn off one of the first switches and maintain the state of the other ones of the switches,
wherein the control circuit includes a first comparator and a control unit configured to control the first switches, and a second switch series-coupled with a current source between the first terminal and a node of application of a reference potential, and wherein the first comparator has a positive input coupled to the first terminal, a negative input coupled to a junction point of the second switch and of the current source, and an output coupled to an input of the control unit.

22. The circuit of claim 21 wherein each first switch comprises a MOS transistor.

23. The circuit of claim 21 wherein the second switch is of the same type as the first switches.

24. A device, comprising:
a first terminal;
a second terminal;
a first plurality of switches coupled between the first terminal and the second terminal;
a control circuit coupled to each one of the first plurality of switches and configured to provide a control signal to each one of the first plurality of switches;
a first comparator having a first input coupled to a reference voltage and a second input coupled to the first terminal, and an output coupled to a first input of the control circuit;
a current source; and
a second switch coupled between the current source and the first terminal.

25. The device of claim 24 wherein each first switch comprises two series-coupled MOS transistors having their gates coupled together.

* * * * *